(12) United States Patent
Yen et al.

(10) Patent No.: US 9,997,429 B2
(45) Date of Patent: Jun. 12, 2018

(54) TRENCH-TYPE HEAT SINK STRUCTURE APPLICABLE TO SEMICONDUCTOR DEVICE

(71) Applicant: REALTEK SEMICONDUCTOR CORPORATION, Hsinchu (TW)

(72) Inventors: Hsiao-Tsung Yen, Hsinchu (TW); Yuh-Sheng Jean, Hsinchu County (TW); Ta-Hsun Yeh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days. days.

(21) Appl. No.: 15/486,169

(22) Filed: Apr. 12, 2017

(65) Prior Publication Data
US 2017/0301601 A1    Oct. 19, 2017

(30) Foreign Application Priority Data
Apr. 13, 2016    (TW) .............................. 105111438 A

(51) Int. Cl.
*H01L 23/00* (2006.01)
*H01L 23/367* (2006.01)

(52) U.S. Cl.
CPC .. *H01L 23/367* (2013.01); *H01L 2924/10253* (2013.01); *H01L 2924/14* (2013.01)

(58) Field of Classification Search
CPC ...................................................... H01L 23/367
See application file for complete search history.

(56) References Cited

U.S. PATENT DOCUMENTS

| | | | |
|---|---|---|---|
| 2009/0160013 A1* | 6/2009 | Abou-Khalil | ......... H01L 21/743 257/509 |
| 2009/0282852 A1 | 11/2009 | Venkatasubramanian et al. | |
| 2011/0089517 A1 | 4/2011 | Venezia et al. | |

\* cited by examiner

*Primary Examiner* — William Harriston
(74) *Attorney, Agent, or Firm* — WPAT, PC

(57) ABSTRACT

The present invention discloses a trench-type heat sink structure applicable to semiconductor devices. An embodiment of the present invention comprises: a first semiconductor substrate; a heat source including at least one heat spot, in which the heat source is on/in the semiconductor substrate or being a part of the semiconductor substrate; at least one first heat conduction layer; at least one first heat conduction structure configured to connect the at least one heat spot with the at least one first heat conduction layer; at least one heat sink trench; and at least one second heat conduction structure configured to connect the at least one first heat conduction layer with the at least one heat sink trench, so as to transmit heat from the heat source to the at least one heat sink trench.

19 Claims, 7 Drawing Sheets

TRENCH-TYPE HEAT SINK STRUCTURE APPLICABLE TO SEMICONDUCTOR DEVICE

BACKGROUND OF THE INVENTION

1. Field of the Invention

The present invention relates to a heat sink structure, especially to a heat sink structure applicable to semiconductor devices.

2. Description of Related Art

A semiconductor device will generate heat during its operation, and therefore a heat sink design is necessary for preventing the operation from being affected by overheating. A conventional heat sink design for a semiconductor device is a package level heat sink design or a PCB (printed circuit board) level heat sink design. A conventional package level heat sink design makes use of an external heat sink device for dissipating heat from a packaged semiconductor device; and a conventional PCB level heat sink design makes use of an external heat sink device for dissipating heat from a printed circuit board on which a semiconductor device is mounted. The heat sinking capability of the above-mentioned heat sink designs is becoming insufficient as the development of semiconductor processes progresses. For a semiconductor chip made by an advanced process (e.g., a process of minimum linewidth being 55 nanometer or less), transistors are scaled down such that the number of the transistors per unit area is increased while the linewidth and spacing therebetween are shrunk, and thus it is becoming more and more difficult to dissipate heat from such semiconductor chip effectively with conventional heat sink designs.

In light of the above, the industry desires a technique for effectively dissipating heat from a heat source (e.g., a transistor) of a semiconductor device, so as to improve with the development of semiconductor processes at the same time.

Some prior art is found in the following literature: U.S. published patent application of Pub. No. US2011/0089517A1.

SUMMARY OF THE INVENTION

An object of the present invention is to provide a trench-type heat sink structure applicable to semiconductor devices, so as to solve the problems of the prior art.

The present invention discloses a trench-type heat sink structure applicable to semiconductor devices. An embodiment of the trench-type heat sink structure comprises: a first semiconductor substrate; a heat source including at least one heat spot, in which the heat source is on or in the semiconductor substrate or the heat source being a part of the semiconductor substrate; at least one first heat conduction layer; at least one first heat conduction structure configured to connect the at least one heat spot with the at least one first heat conduction layer; at least one heat sink trench; and at least one second heat conduction structure configured to connect the at least one first heat conduction layer and the at least one heat sink trench, so as to transmit heat from the heat source to the at least one heat sink trench. In an exemplary implementation of this embodiment, the heat source includes a transistor and the at least one heat spot includes at least one terminal of the transistor, while the at least one heat sink trench is in an electrically floating state. In another exemplary implementation of this embodiment, the heat source includes at least one pickup of the first semiconductor substrate. In a further exemplary implementation of this embodiment, the at least one heat sink trench includes at least one trench heat conductor and at least one insulator which insulates the at least one trench heat conductor from the first semiconductor substrate.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in this specification, such term should be explained accordingly. Besides, the connection between objects in the disclosed embodiments can be direct or indirect provided that these embodiments are still applicable under such connection. Said "indirect" means that an intermediate object or a physical space is existed between the objects.

The present disclosure includes a trench-type heat sink structure applicable to semiconductor devices. The design of the heat sink structure is an integrated circuit (IC) level design and capable of dissipating heat from an integrated circuit directly, so that the heat sink structure is able to cure heat dissipation problems related to advanced semiconductor processes (e.g., processes of minimum linewidth being 55 nanometer or less) and is applicable to a three-dimensional integrated circuit (3D IC). The heat sink structure of the present invention could be included in a finished product (e.g., a packaged IC) or an unfinished product (e.g., an IC further requiring packaging), and may include some known element. The description or illustration of the said known element will be omitted as long as the remaining disclosure is sufficient for understanding and enablement of the present invention.

Figure 1:
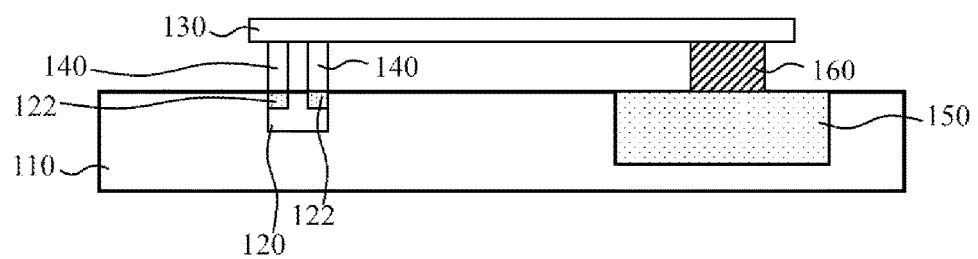
FIG. 1 illustrates an embodiment of the trench-type heat sink structure of the present invention.

Please refer to FIG. 1. FIG. 1 illustrates an embodiment of the trench-type heat sink structure of the present invention. As shown in FIG. 1, the trench-type heat sink structure 100 includes a first semiconductor substrate 110, a heat source 120, at least one first heat conduction layer 130, at least one first heat conduction structure 140, at least one heat sink trench 150, and at least one second heat conduction structure 160. The first semiconductor substrate 110 could be a silicon substrate or a semiconductor substrate that is well known in this industry or developed by those of skill in the art. The first semiconductor substrate 110 in this embodiment has one or more integrated circuit(s) formed thereon;

however, this is not a limitation to the implementation of the present invention. The heat source 120 is positioned on or in the first semiconductor substrate 110, or being a part of the first semiconductor substrate 110. In other words, the heat source 120 is a part of the first semiconductor substrate 110 or not. In addition, the heat source 120 includes at least one heat spot 122. For instance, the heat source 120 includes a transistor, and the at least one heat spot 122 includes at least one terminal (e.g., a source terminal, a drain terminal or a gate terminal) of the transistor, in which an example of the transistor is a transistor made in compliance with a semiconductor process of minimum linewidth being 55 nanometer or less but not limited to such. In another instance, the at least one heat spot 122 includes at least one pickup of the first semiconductor substrate 110.

Figure 2:
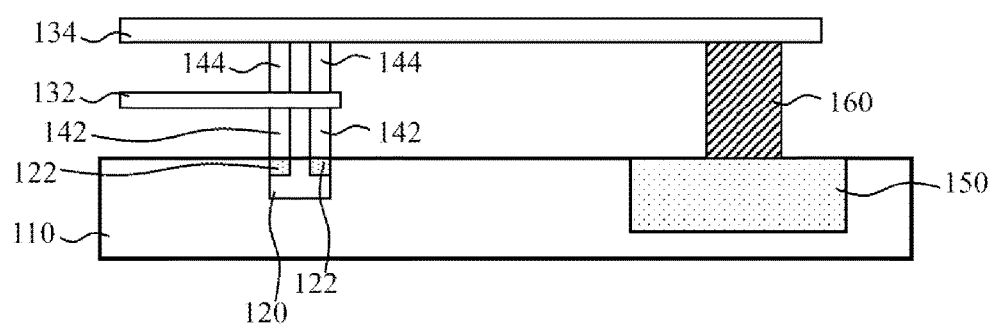
FIG. 2 illustrates a modification of the embodiment of FIG. 1.

Accordingly, the at least one first heat conduction structure 140 is configured to connect the at least one heat spot 122 and the at least one first heat conduction layer 130, so as to transmit heat from the at least one heat spot 122 to the at least one first heat conduction layer 130. The at least one first heat conduction layer 130 in this embodiment includes at least one metal layer. In another embodiment, the at least one first heat conduction layer 130 includes at least one nonmetal layer (e.g., a graphite layer) of good heat conductivity as long as the implementation with such nonmetal layer is practicable. In yet another embodiment, the at least one first heat conduction layer 130 includes at least a metal layer and at least a nonmetal layer. For instance, as shown in FIG. 2, the at least one first heat conduction layer 130 includes a first bottom heat conduction layer 132 and a first top heat conduction layer 134. In some embodiments, one or more heat conduction layer(s) (not shown in FIG. 2) may be included between the first bottom heat conduction layer 132 and the first top heat conduction layer 134, if necessary for increased heat conduction. The at least one heat conduction structure 140 includes at least one first bottom heat conductor 142 and at least one first top heat conductor 144. In some embodiments, more heat conductor(s) (not shown in FIG. 2) may be included in the space between the at least one first bottom heat conductor 142 and the at least one first top heat conductor 144, if necessary for increased heat conduction. In some embodiments, the at least one first bottom heat conductor 142 has at least a contact structure formed by a semiconductor process. The contact structure is a through hole filled with material having good heat conduction, such as metal material (e.g., gold, silver, copper, copper alloy, aluminum, aluminum alloy) or nonmetal material (e.g., graphite, graphene), and is configured to connect the first top heat conduction layer 134 with a first underneath heat conduction layer (not shown) that is underneath the first top heat conduction layer 134. The first underneath heat conduction layer is included in the at least one first heat conduction layer 130. The first underneath heat conduction layer is a first intermediate heat conduction layer positioned between the first bottom heat conduction layer 132 and the first top heat conduction layer 134, or the first underneath heat conduction layer itself is the first bottom heat conduction layer 132, depending on the number of layers used.

Figure 3:
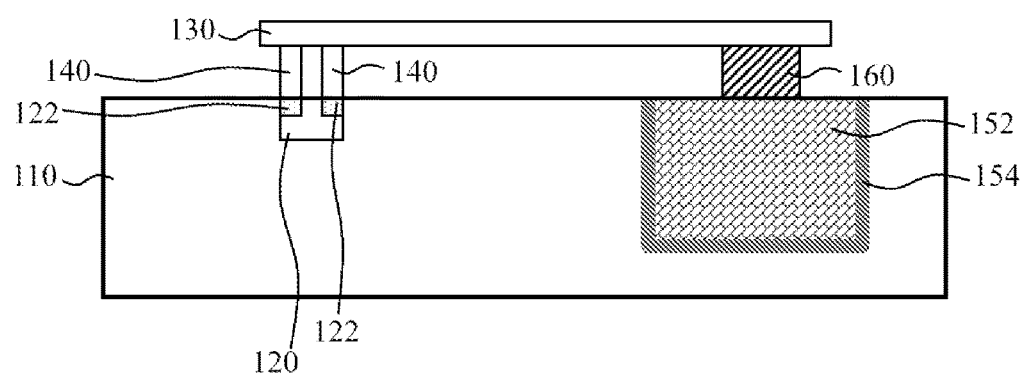
FIG. 3 illustrates a modification of the embodiment of FIG. 1.

Please refer to FIG. 1 again. Regarding the at least one heat sink trench 150, it is configured to be in an electrically floating state or of a specific voltage. For instance, the aforementioned heat source 120 includes a transistor, and the at least one heat sink trench 150 includes at least one trench heat conductor 152 and at least one insulator 154 as shown in FIG. 3. As a result, the at least one heat sink trench 150 is in an electrically floating state to prevent the normal operation of the transistor from being affected. The at least one insulator 154 could be a silica insulator or other types of insulator that is configured to insulate the at least one trench heat conductor 152 from the first semiconductor substrate 110 so as to prevent leakage current or other problems. However, provided that the operation of the transistor is not substantially affected, the at least one heat sink trench 150 could be of a specific voltage (e.g., a constant voltage) rather than in an electrically floating state. In another instance, the at least one heat spot 122 is at least one pickup of the first semiconductor substrate 110, and the at least one heat sink trench 150 is in an electrically floating state or of a specific voltage that is a constant voltage such as a DC high voltage, a DC low voltage, or a ground voltage. Regarding the at least one heat sink trench 150, it may be formed by a TSV (through silicon via) process to include t at least one TSV trench. However, other kinds of semiconductor process could be adopted for realizing the at least one heat sink trench 150, if practicable. The at least one second heat conduction structure 160 is configured to connect the at least one first heat conduction layer 130 with the at least one heat sink trench 150, so as to transmit the heat from the heat source 120 to the at least one heat sink trench 150 for heat dissipation. In this embodiment, the at least one heat sink trench 150 is formed by processing (e.g., etching) the first semiconductor substrate 110, and the at least one second heat conduction structure 160 includes at least one heat conductor. However, the above-mentioned characteristics are optional for the implementation of the present invention. Other embodiments are disclosed as shown in FIG. 6 and FIG. 7.

Figure 4:
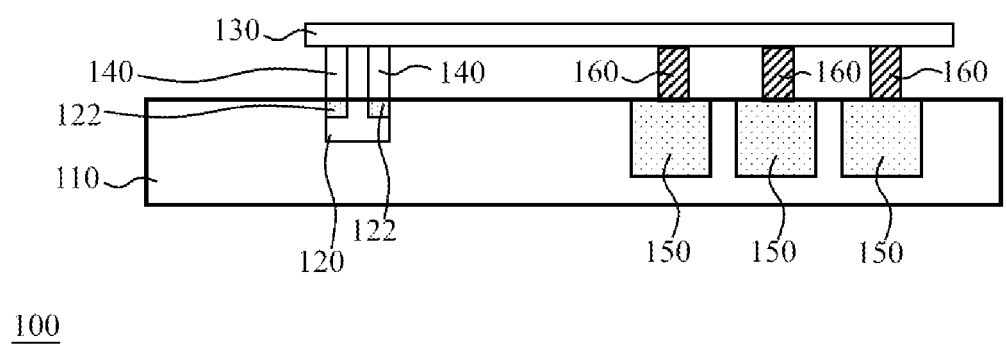
FIG. 4 illustrates a modification of the embodiment of FIG. 1.
Figure 5:
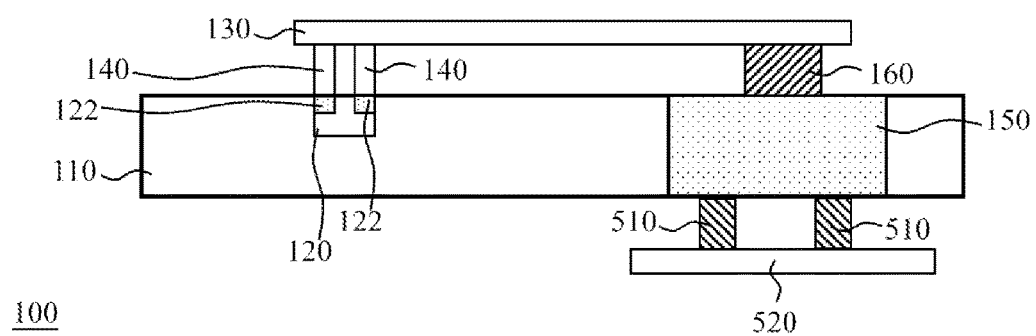
FIG. 5 illustrates a modification of the embodiment of FIG. 1.

In order to enhance heat dissipation effect or achieve design requirements, the trench-type heat sink structure 100 of FIG. 1 could be modified as shown in FIG. 4. According to a modification of the heat sink structure 100, the at least one heat sink trench 150 includes S number of heat sink trench units 150 which constitute a trench array in the form of a predetermined pattern (e.g., a parallel pattern or a known/self-designed pattern), S being an integer greater than one (e.g., S=3 in FIG. 4). As shown in FIG. 5, according to another modification of the heat sink structure 100, the at least one heat sink trench 150 penetrates the first semiconductor substrate 110, and the trench-type heat sink structure 100 further includes at least one third heat conduction structure 510 and at least one heat dissipation body 520. The at least one third heat conduction structure 510 is configured to connect the at least one heat sink trench 150 with the at least one heat dissipation body 520, so as to transmit the heat from the heat source 120 to the at least one heat dissipation body 520 through the heat sink trench 150 for efficient heat dissipation. The structure of FIG. 5 could be further modified. For instance, the at least one heat dissipation body 520 includes N heat dissipation units which constitute a heat dissipation array in the form of a predetermined pattern (e.g., a parallel pattern or a known/self-designed pattern having large exposed surface areas for heat dissipation), N being an integer greater than one. In another instance, the at least one heat dissipation body 520 includes at least one of the follows: at least one metal pad exclusively for the implementation of the present invention; at least one dummy metal layout that is common in the field of IC design; at least a lead frame; and at least an exposed pad (epad). In some embodiments, the at least one heat dissipation body 520 may be made of graphite, nanotube, etc. suitable for semiconductor processes and robust for heat dissipation. Since the above-mentioned metal layout, lead frame and exposed pad are well known in this industry field, details are omitted for brevity.

Figure 6:
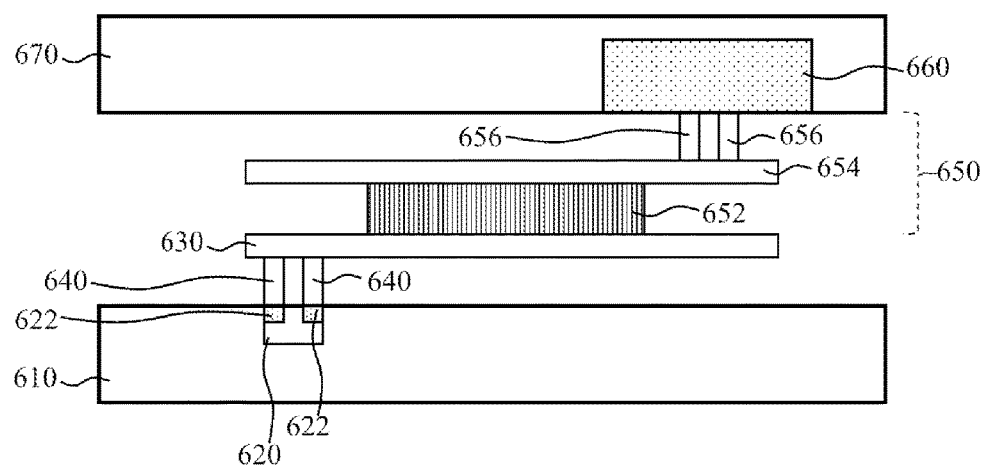
FIG. 6 illustrates another embodiment of the trench-type heat sink structure of the present invention.

Please refer to FIG. 6 that illustrates another embodiment of the trench-type heat sink structure of the present invention. As shown in FIG. 6, the trench-type heat sink structure 600 includes: a first semiconductor substrate 610; a heat source 620 including at least one heat spot 622; at least one first heat conduction layer 630; at least one first heat conduction structure 640; at least one second heat conduction structure 650; at least one heat sink trench 660; and at least one second semiconductor substrate 670. In comparison with the embodiment of FIG. 1, the at least one heat sink trench 660 of this embodiment is embedded in the second semiconductor substrate 670, and thus the at least one second heat conduction structure 650 includes at least one joint structure 652, at least one second heat conduction layer 654, and at least one heat conductor 656. The at least one joint structure 652 is configured to connect the at least one heat conduction layer 630 with the at least one second heat conduction layer 654; the at least one heat conductor 656 is configured to connect the at least one second heat conduction layer 654 with the at least one heat sink trench 660, so as to transmit heat from the heat source 620 to the at least one heat sink trench 660 for heat dissipation.

Figure 7:
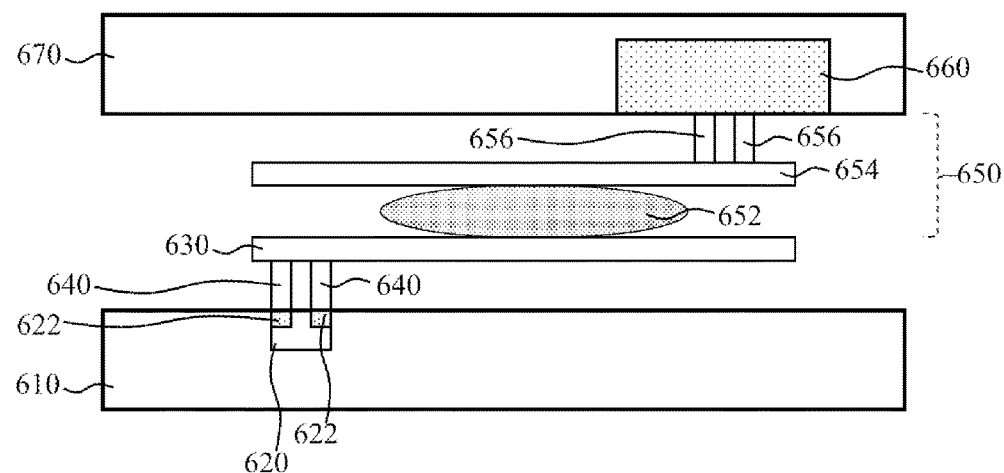
FIG. 7 illustrates an exemplary implementation of the joint structure of FIG. 6.

In this embodiment, the at least one joint structure 652 includes at least one micro bump as shown in FIG. 7. This micro bump can be formed by combining a micro bump of the first heat conduction layer 630 with a micro bump of the second heat conduction layer 654. The implementation and modification of the at least one second heat conduction layer 654 can be derived from the description of the first heat conduction layer 130, the first bottom heat conduction layer 132 and the first top heat conduction layer 134 as shown in FIG. 1 and FIG. 2, and the descriptions thereof are omitted for brevity. Similarly, the implementation and modification of the at least one heat conductor 656 can be derived from the description of the first heat conduction structure 140, the first bottom heat conductor 142 and the first top heat conductor 144 as shown in FIG. 1 and FIG. 2. The implementation and modification of the at least one heat sink trench 660 can be derived from the description of the heat sink trench 150 as shown in FIGS. 1, 3, 4, and 5. The implementation and modification of the second semiconductor substrate 670 can be easily derived from the description of the first semiconductor substrate 110 as shown in FIG. 1.

It should be noted that in order to prevent the trench-type heat sink structure of the present invention from damage or erosion, packaging material can be applied to encapsulate the trench-type heat sink structure while the aforementioned heat dissipation body may be exposed to outside for enhancement of heat dissipation. However, the above-mentioned characteristics are optional for the implementation of the present invention. It should also be noted that there might be some device, circuit, or material (not shown in the figures) that existsbetween any two components of the aforementioned embodiments. Said device, circuit, or material is used for protection, support, insulation, connection, or a known/self-defined function, and may exist in the same semiconductor device as the present invention.

Please note that each of the above-disclosed embodiments includes one or more features; however, this doesn't mean that one applying the present invention should make use of all the features of one embodiment at once, or should carry out different embodiments separately. In other words, if an implementation derived from one or more of the embodiments is applicable, a person of ordinary skill in the art can selectively make use of some or all of the features in one embodiment or selectively make use of a combination of some or all features in several embodiments to have such implementation realized, so as to increase the flexibility for application of the present invention. Please also note that the shape, size, scale, etc. in the drawings are illustrations for understanding, and not limitations to the scope of the present invention.

In summary, the trench-type heat sink structure of the present invention is applicable to semiconductor devices and capable of dissipating heat from integrated circuits immediately, so as to solve heat dissipation problems of an advanced semiconductor process (e.g., a process of minimum linewidth being 55 nanometer or less). Furthermore, the heat sink structure of the present invention can be realized through a mature and simple semiconductor process, and thus has advantages of good heat dissipation and reasonably low cost in comparison with other heat dissipating mechanisms in the prior art.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A trench-type heat sink structure applicable to semiconductor devices, the trench-type heat sink structure comprising:
    a first semiconductor substrate;
    a heat source including at least one heat spot, the heat source being on the semiconductor substrate or being a part of the semiconductor substrate;
    at least one first heat conduction layer;
    at least one first heat conduction structure configured to connect the at least one heat spot with the at least one first heat conduction layer;
    at least one heat sink trench; and
    at least one second heat conduction structure configured to connect the at least one first heat conduction layer and the at least one heat sink trench, so as to transmit heat from the heat source to the at least one heat sink trench,
    wherein the at least one first heat conduction layer includes a first bottom heat conduction layer and a first top heat conduction layer, the at least one first heat conduction structure includes at least one first bottom heat conductor and at least one first top heat conductor, the at least one first bottom heat conductor is configured to connect the first bottom heat conduction layer with the at least one heat spot, the at least one first top heat conductor is configured to connect the first top heat conduction layer with a first underneath heat conduction layer, and the first underneath heat conduction layer is included in the at least one first heat conduction layer and is a first intermediate heat conduction layer or the first bottom heat conduction layer.

2. The trench-type heat sink structure of claim 1, wherein the heat source includes a transistor, the at least one heat spot includes at least one terminal of the transistor, and the at least one heat sink trench is in an electrically floating state.

3. The trench-type heat sink structure of claim 2, wherein the scale of the transistor conforms to a semiconductor manufacturing rule of minimum linewidth being 55 nanometer or less.

4. The trench-type heat sink structure of claim 1, wherein the at least one heat spot includes at least one pickup of the first semiconductor substrate.

5. The trench-type heat sink structure of claim 1, wherein the at least one heat sink trench is formed in the first semiconductor substrate.

6. The trench-type heat sink structure of claim 5, wherein the at least one heat sink trench includes at least one trench heat conductor and at least one insulator which insulates the at least one trench heat conductor from the first semiconductor substrate.

7. The trench-type heat sink structure of claim 1, wherein the at least one heat sink trench is formed in a second semiconductor substrate, the at least one second heat conduction structure includes at least one joint structure, at least one second heat conduction layer and at least one heat conductor, the at least one second heat conduction layer is configured to connect with the at least one first heat conduction layer through the at least one joint structure, and the at least one heat conductor is configured to connect the at least one second heat conduction layer with the at least one heat sink trench, so as to transmit the heat from the heat source to the at least one heat sink trench.

8. The trench-type heat sink structure of claim 7, wherein the at least one heat sink trench includes at least one trench heat conductor and at least one insulator insulating the at least one trench heat conductor from the second semiconductor substrate.

9. The trench-type heat sink structure of claim 7, wherein the at least one heat sink trench includes a plurality of heat sink trench units.

10. The trench-type heat sink structure of claim 7, wherein the at least one heat sink trench penetrates the second semiconductor substrate, and the trench-type heat sink structure further comprises: at least one third heat conduction structure and at least one heat dissipation body, in which the at least one third heat conduction structure is configured to connect the at least one heat dissipation body with the at least one heat sink trench so as to transmit the heat from the heat source to the at least one heat dissipation body through at least one heat sink trench.

11. The trench-type heat sink structure of claim 10, wherein the at least one heat dissipation body includes a plurality of heat dissipation units.

12. The trench-type heat sink structure of claim 7, wherein the at least one second heat conduction layer includes a second bottom heat conduction layer and a second top heat conduction layer, the at least one heat conductor includes at least one second bottom heat conductor and at least one second top heat conductor, the at least one second bottom heat conductor is configured to connect the second bottom heat conduction layer with the at least one heat sink trench, the at least one second top heat conductor is configured to connect the second top heat conduction layer with a second underneath heat conduction layer, the second underneath heat conduction layer is included in the at least one second heat conduction layer and is a second intermediate heat conduction layer or the second bottom heat conduction layer, and the second top heat conduction layer is configured to connect with the at least one first heat conduction layer through the at least one joint structure.

13. The trench-type heat sink structure of claim 7, wherein the at least one joint structure includes at least one micro bump.

14. The trench-type heat sink structure of claim of claim 1, which is applied to a three-dimensional integrated circuit (3D IC).

15. The trench-type heat sink structure of claim of claim 1, wherein the at least one heat sink trench includes a TSV (through silicon via) trench.

16. The trench-type heat sink structure of claim of claim 1, wherein the at least one first heat conduction layer includes at least one metal layer and/or at least one nonmetal layer.

17. A trench-type heat sink structure applicable to semiconductor devices, the trench-type heat sink structure comprising:
a first semiconductor substrate;
a heat source including at least one heat spot, the heat source being on the semiconductor substrate or being a part of the semiconductor substrate;
at least one first heat conduction layer;
at least one first heat conduction structure configured to connect the at least one heat spot with the at least one first heat conduction layer;
at least one heat sink trench formed in the first semiconductor substrate; and
at least one second heat conduction structure configured to connect the at least one first heat conduction layer and the at least one heat sink trench, so as to transmit heat from the heat source to the at least one heat sink trench,
wherein the at least one heat sink trench includes a plurality of heat sink trench units.

18. A trench-type heat sink structure applicable to semiconductor devices, the trench-type heat sink structure comprising:
a first semiconductor substrate;
a heat source including at least one heat spot, the heat source being on the semiconductor substrate or being a part of the semiconductor substrate;
at least one first heat conduction layer;
at least one first heat conduction structure configured to connect the at least one heat spot with the at least one first heat conduction layer;
at least one heat sink trench formed in the first semiconductor substrate; and
at least one second heat conduction structure configured to connect the at least one first heat conduction layer and the at least one heat sink trench, so as to transmit heat from the heat source to the at least one heat sink trench,
wherein the at least one heat sink trench penetrates the first semiconductor substrate, and the trench-type heat sink structure further comprises: at least one third heat conduction structure and at least one heat dissipation body, in which the at least one third heat conduction structure is configured to connect the at least one heat sink trench with the at least one heat dissipation body so as to transmit the heat from the heat source to the at least one heat dissipation body through at least one heat sink trench.

19. The trench-type heat sink structure of claim 18, wherein the at least one heat dissipation body includes a plurality of heat dissipation units.

* * * * *